United States Patent
Wang et al.

(10) Patent No.: US 7,646,203 B2
(45) Date of Patent: Jan. 12, 2010

(54) DEFECT DETECTION SYSTEM WITH MULTILEVEL OUTPUT CAPABILITY AND METHOD THEREOF

(75) Inventors: Chien-Kuo Wang, Hsin-Chu (TW);
Tai-Chi Kao, Hsinchu (TW);
Tsuoe-Hsiang Liao, Hsin-Chu (TW);
Yuan-Che Lee, Taichung (TW);
Yu-Ming Sun, Taoyuan County (TW)

(73) Assignee: United Microelectronics Corp., Hsin-Chu (TW)

( * ) Notice: Subject to any disclaimer, the term of this patent is extended or adjusted under 35 U.S.C. 154(b) by 255 days.

(21) Appl. No.: 11/778,635

(22) Filed: Jul. 16, 2007

(65) Prior Publication Data
US 2009/0021266 A1    Jan. 22, 2009

(51) Int. Cl.
*H01H 31/02* (2006.01)
(52) U.S. Cl. .................. 324/555; 341/120; 341/126; 341/155; 324/765; 702/127
(58) Field of Classification Search .................. 324/555
See application file for complete search history.

(56) References Cited

U.S. PATENT DOCUMENTS

| | | | | |
|---|---|---|---|---|
| 5,142,235 A | * | 8/1992 | Matsumoto et al. | 324/537 |
| 5,444,637 A | * | 8/1995 | Smesny et al. | 702/127 |
| 5,661,481 A | * | 8/1997 | Muramatsu | 341/120 |
| 5,705,925 A | * | 1/1998 | Lee | 324/158.1 |
| 6,589,860 B1 | * | 7/2003 | Ang et al. | 438/613 |
| 6,657,878 B2 | * | 12/2003 | Lien et al. | 365/49.1 |
| 7,200,057 B2 | * | 4/2007 | Pineda De Gyvez et al. | 365/201 |
| 7,379,007 B2 | * | 5/2008 | Noguchi | 341/155 |
| 2006/0125672 A1 | * | 6/2006 | Budzelaar | 341/155 |
| 2007/0075720 A1 | * | 4/2007 | Lee | 324/765 |
| 2008/0067381 A1 | * | 3/2008 | Hiroi et al. | 250/310 |

* cited by examiner

*Primary Examiner*—Timothy J Dole
*Assistant Examiner*—Benjamin M Baldridge
(74) *Attorney, Agent, or Firm*—Winston Hsu (57) ABSTRACT

A defect detection system and related method take advantage of multilevel detection technique for detecting defects on an integrated circuit. The defect detection system utilizes an analog-to-digital converter for converting an analog sensing signal into an output code having a plurality of bits. The defect detection methods include an open test method and a short test method. The open and short test methods both include a calibrating method and a testing method individually. The calibrating method functions to determine a preset reference voltage for the analog-to-digital converter based on a predetermined code. The testing method makes use of the preset reference voltage and the predetermined code for generating the output code having a plurality of bits. The output code is then utilized to determine whether or not there are open or short defects on the integrated circuit and to classify the defects.

11 Claims, 12 Drawing Sheets

DEFECT DETECTION SYSTEM WITH MULTILEVEL OUTPUT CAPABILITY AND METHOD THEREOF

BACKGROUND OF THE INVENTION

1. Field of the Invention

The present invention relates in general to a defect detection system and method, and more particularly, to a defect detection system and method capable of outputting a multilevel signal for identifying defects.

2. Description of the Prior Art

During the fabrication process, a wafer receives a number of doping, layering, patterning, and metallization steps. Each of these steps must meet exacting physical requirements. However, all steps have some variation from perfect calibration, thereby resulting in some variation on the wafer surface, especially while bringing up a new semiconductor fabrication process. Accordingly, a variety of yield monitors are required to determine the health of the process and to find systematic problems.

Several known conduction line structures, such as polycrystal lines, diffusion lines, metal lines, and N-type or P-type well lines are subject to being detected for determining whether there are undesirable defects existing. Furthermore, there are electrical-isolated routes, each of which may comprise two adjacent and electrical-isolated conduction lines, subjected to being detected for determining whether there are undesirable defects existing. Once detected, these defects are analyzed in a process called failure analysis. During failure analysis, valuable information regarding problems with fabrication materials, process recipes, ambient air, personnel, and machines can be discovered. Therefore, detection of defects on an integrated circuit is critical to high yields and process control.

Figure 1:
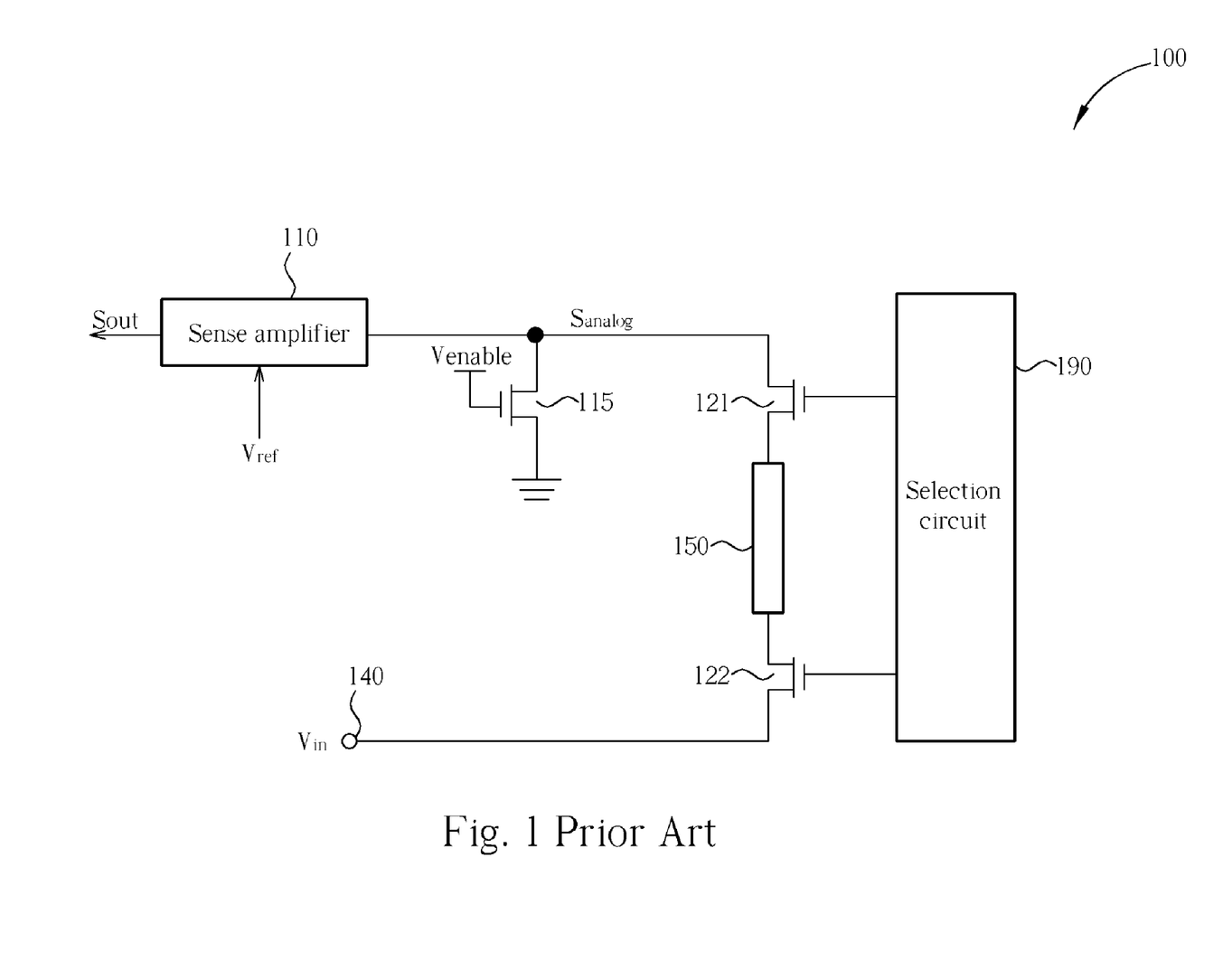
FIG. 1 is a schematic diagram showing a prior art defect detection system for identifying defects in an integrated circuit.

Please refer to FIG. 1, which is a schematic diagram showing a prior art defect detection system 100 for identifying defects in an integrated circuit. The defect detection system 100 comprises a sense amplifier 110, a pull-down transistor 115 having a gate furnished with an enable signal Venable, selection transistors 121 and 122, and a selection circuit 190. The gates of the selection transistors 121 and 122 are both electrically connected to the selection circuit 190 for performing a selecting process so as to select a test route 150 as a selected test route for testing. A test input terminal 140 is coupled to the selection transistor 122 for inputting an input voltage Vin.

The sense amplifier 110 has a first terminal for receiving an analog sensing signal Sanalog, a second terminal for receiving a reference voltage Vref, and an output terminal for outputting an output signal Sout. In general, the first terminal of the sense amplifier 110 and the test input terminal 140 are connected to two pluralities of selection transistors having all the gates connected to the selection circuit 190 respectively for selecting a certain test route from a plurality of test routes to be tested as the selected test route for testing.

However, the output signal Sout outputted from the sense amplifier 110 is fundamentally a two-level signal similar to one-bit signal in a digital system, which can be utilized only for identifying whether or not the selected test route has defects. Accordingly, operational flexibility of the defect detection system 100 is quite limited. That is to say, the prior art defect detection system 100 cannot meet requirements when multilevel output signals are preferred under some test situations.

SUMMARY OF THE INVENTION

In accordance with an embodiment of the present invention, a defect detection system having multilevel output capability is provided for higher operational flexibility. The defect detection system comprises an analog-to-digital converter, a test input terminal, and a pull-down device. The analog-to-digital converter has an input terminal coupled to a first terminal of a selected test route, a reference input terminal, and an output port. The test input terminal is coupled to a second terminal of the selected test route. The pull-down device is coupled between the input terminal of the analog-to-digital converter and ground.

The present invention further provides a method for performing an open test for analyzing an open in a test route of an integrated circuit. The method for performing the open test comprises a calibrating method and a testing method. The calibrating method of the open test comprises: connecting a pull-down resistor between the input terminal of an analog-to-digital converter and ground, connecting an open calibration test route between a test input terminal and the input terminal of the analog-to-digital converter, applying an input voltage to the test input terminal, applying a reference voltage to the reference input terminal of the analog-to-digital converter, and adjusting the reference voltage until an output code of the analog-to-digital converter is equal to a predetermined code and setting the adjusted reference voltage as a preset reference voltage. The testing method of the open test comprises: connecting the pull-down resistor between the input terminal of the analog-to-digital converter and ground, connecting a test route between a test input terminal and the input terminal of the analog-to-digital converter, applying the input voltage to the test input terminal, applying the preset reference voltage determined by the calibrating method of the open test to the reference input terminal of the analog-to-digital converter, and determining whether or not the test route is open according to an input code of the analog-to-digital converter.

Furthermore, the present invention provides a method for performing a short test for analyzing a short in a test route of an integrated circuit. The method for performing the short test comprises a calibrating method and a testing method. The calibrating method of the short test comprises: connecting a pull-down resistor between the input terminal of an analog-to-digital converter and ground, connecting a short calibration test route between a test input terminal and the input terminal of the analog-to-digital converter, applying an input voltage to the test input terminal, applying a reference voltage to the reference input terminal of the analog-to-digital converter, and adjusting the reference voltage until an output code of the analog-to-digital converter is equal to a predetermined code and setting the adjusted reference voltage as a preset reference voltage. The testing method of the short test comprises: connecting the pull-down resistor between the input terminal of the analog-to-digital converter and ground, connecting a test route between a test input terminal and the input terminal of the analog-to-digital converter, applying an input voltage to the test input terminal, applying the preset reference voltage determined by the calibrating method of the short test to the reference input terminal of the analog-to-digital converter, and determining whether or not the test route is shorted according to an output code of the analog-to-digital converter.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
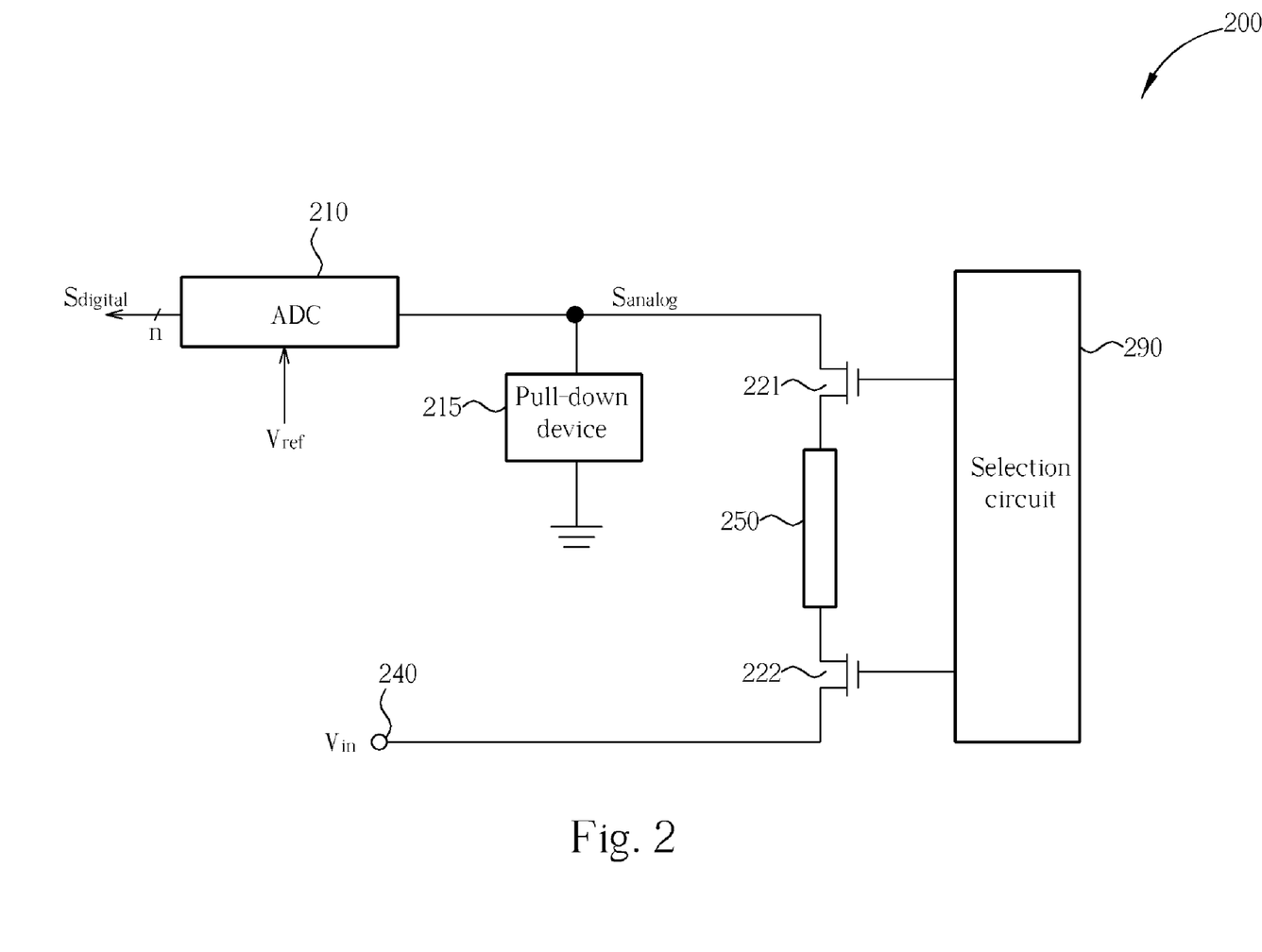
FIG. 2 is a schematic diagram showing a defect detection system for identifying defects in an integrated circuit in accordance with an embodiment of the present invention.

Please refer to FIG. 2, which is a schematic diagram showing a defect detection system 200 for identifying defects in an integrated circuit in accordance with an embodiment of the present invention. The defect detection system 200 comprises an analog-to-digital converter (ADC) 210, a pull-down device 215, a first selection transistor 221, a second selection transistor 222, and a selection circuit 290. The defect detection system 200 can be incorporated in a wafer or a chip to be tested.

The second selection transistor 222 has a gate, a first terminal electrically connected to a test input terminal 240 for receiving an input voltage Vin, and a second terminal electrically connected to a first terminal of a test route 250. Similarly, the first selection transistor 221 has a gate, a first terminal electrically connected to a second terminal of the test route 250, and a second terminal. The first and second selection transistors 221 and 222 can be NMOS transistors or PMOS transistors. The test route 250 can be a conduction line or an electrical-isolated route on a wafer or a chip to be tested. The conduction line means that the first and second terminals of the test route 250 are electrically connected normally. The electrical-isolated route means that the first and second terminals of the test route 250 are electrical-isolated normally. Please note that in the description hereinafter when the first terminal of a certain transistor functions as a source terminal, the second terminal of the certain transistor will function as a drain terminal. On the contrary, when the first terminal of a certain transistor functions as a drain terminal, the second terminal of the certain transistor will function as a source terminal. The selection circuit 290 provides a plurality of selection signals furnished to the gates of the first and second selection transistors 221 and 222. In other words, the gates of the first and second selection transistors 221 and 222 are both electrically connected to the selection circuit 290 for performing a selecting process so as to select the test route 250 as a selected test route for the testing.

The pull-down device 215 has a first terminal electrically connected to the second terminal of the first selection transistor 221 and a second terminal coupled to ground. The pull-down device 215 can be a pull-down resistor having a predetermined resistance. Alternatively, the pull-down device 215 can be an NMOS transistor having a first terminal electrically connected to the second terminal of the first selection transistor 221, a second terminal coupled to ground, and a gate furnished with an enable signal.

The analog-to-digital converter 210 has an input terminal electrically connected to the second terminal of the first selection transistor 221 for receiving an analog sensing signal Sanalog, a reference input terminal for receiving a reference voltage Vref, and an output port for outputting an output code Sdigital having a plurality of bits such as an n-bit output code.

Figure 3:
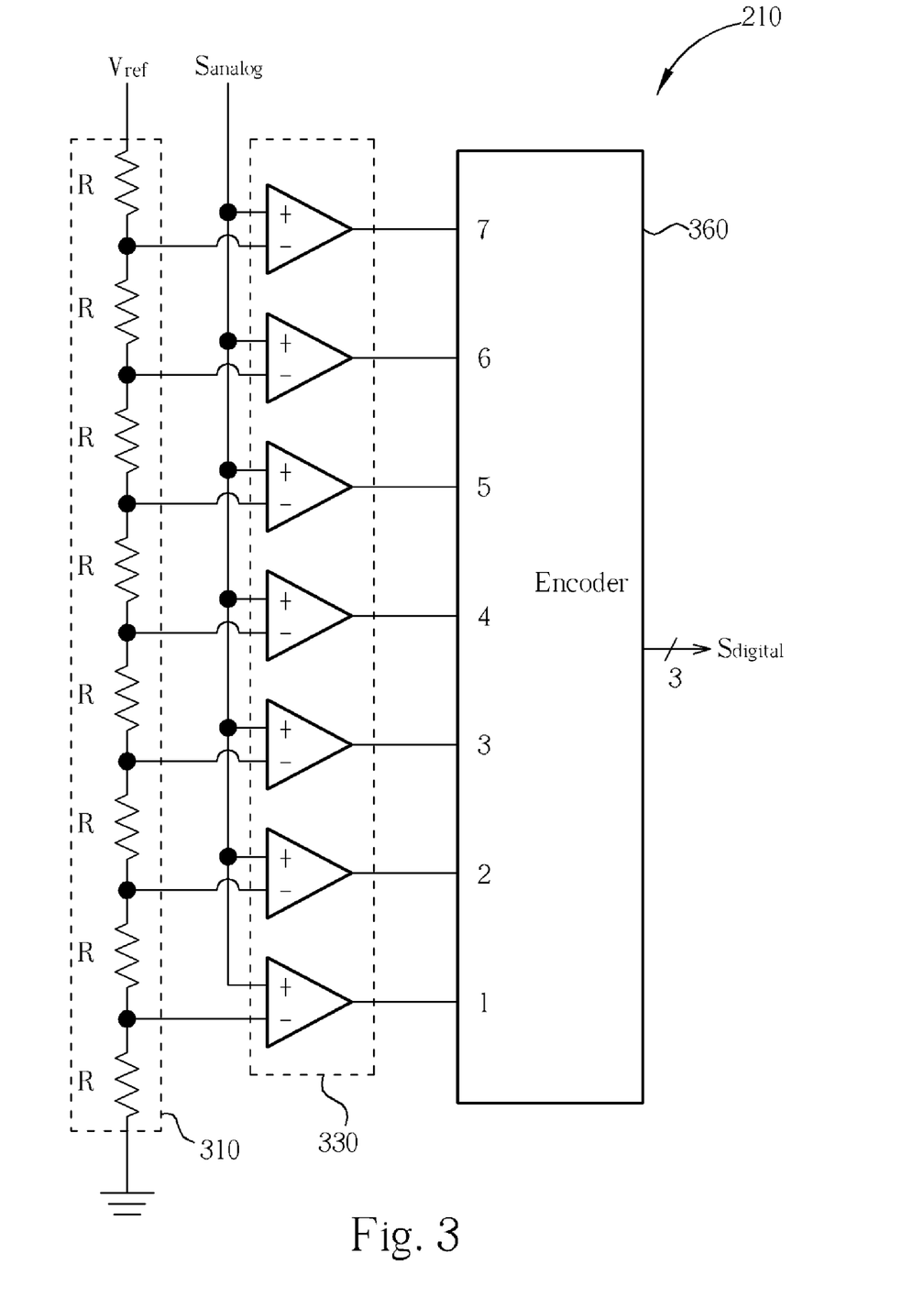
FIG. 3 is a schematic diagram showing the structure of the analog-to-digital converter in FIG. 2 in accordance with an embodiment of the present invention.

Please refer to FIG. 3, which is a schematic diagram showing the structure of the analog-to-digital converter 210 in accordance with an embodiment of the present invention. The analog-to digital converter 210 comprises a plurality of resistors 310, a plurality of comparators 330, and an encoder 360. Each comparator has a first input terminal coupled to the input terminal of the analog-to-digital converter 210 for receiving the analog sensing signal Sanalog, a second input terminal, and an output terminal. The first and second input terminals of one comparator can be a positive input terminal and a negative input terminal of the comparator respectively. The plurality of resistors 310 are electrically connected in series and are coupled between the reference input terminal of the analog-to-digital converter 210 and ground. Each connection node between adjacent resistors of the plurality of resistors 310 is electrically connected to the second input terminal of one corresponding comparator. The encoder 360 has a plurality of input terminals and a plurality of output terminals. In one embodiment, the encoder 360 may have 7 input terminals indexed from 1 to 7 and 3 output terminals as shown in FIG. 3. The index number from low to high may correspond to low-to-high significant bits of corresponding input terminals of the encoder 360. Each input terminal of the encoder 360 is electrically connected to the output terminal of one corresponding comparator. The plurality of terminals of the encoder 360 are coupled to the output port of the analog-to-digital converter 210 for outputting the output code Sdigital having a plurality of bits such as a 3-bit output code. The encoder 360 can be a priority encoder for selecting an input terminal with highest index and having a high logic level in positive logic or a low logic level in negative logic as the input terminal to be encoded.

Figure 4:
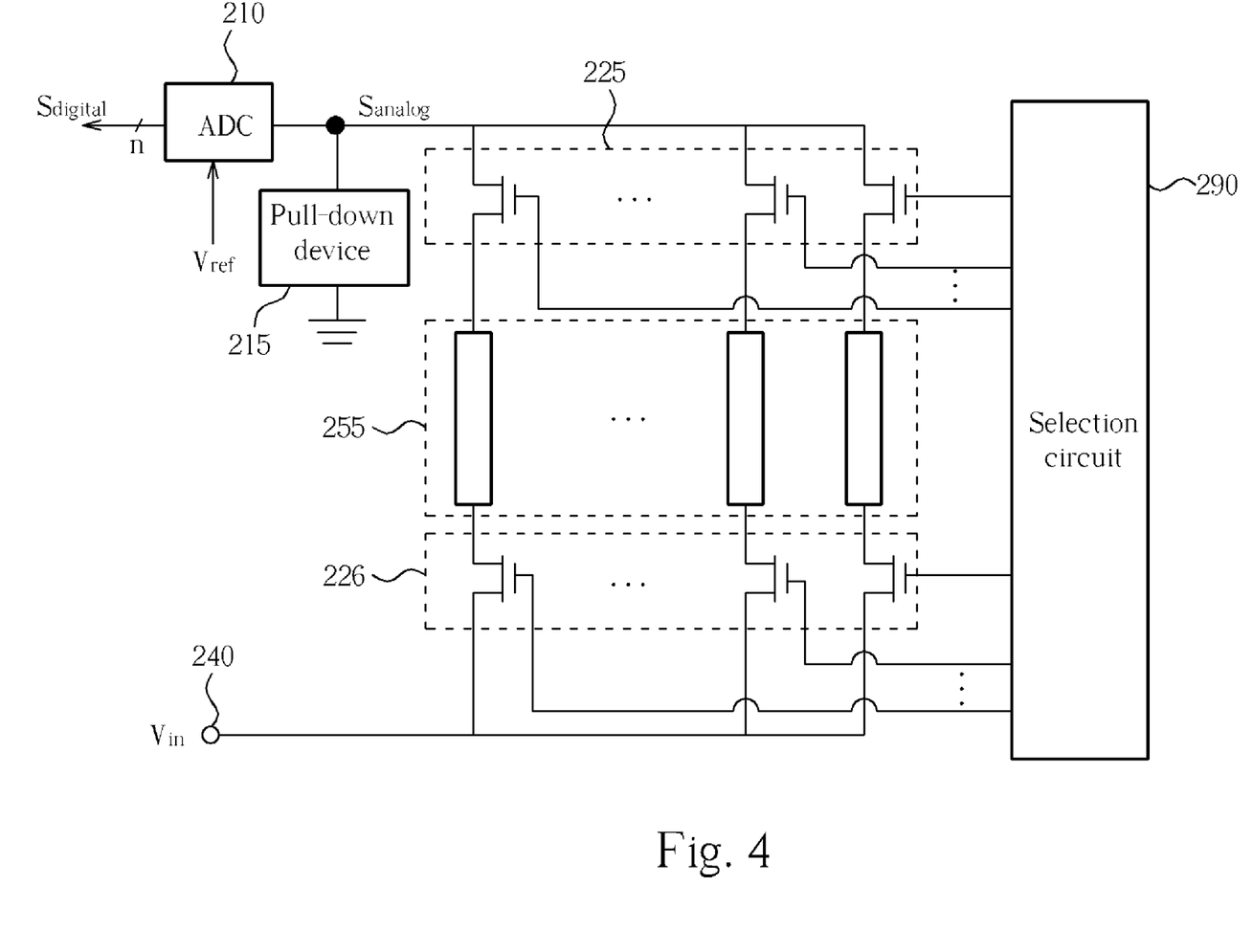
FIG. 4 is a schematic diagram showing a defect detection system for identifying defects in an integrated circuit in accordance with another embodiment of the present invention.

In the embodiment shown in FIG. 2, the input terminal of the analog-to-digital converter 210 and the test input terminal 240 are not limited to be electrically connected to the first and second selection transistors 221 and 222 respectively. As a preferred alternative in another embodiment shown in FIG. 4, the input terminal of the analog-to-digital converter 210 can be electrically connected to a plurality of first selection transistors 225, and the test input terminal 240 can be electrically connected to a plurality of second selection transistors 226. Furthermore, all the gates of the two pluralities of first and second selection transistors are electrically connected to the selection circuit 290 so as to perform a selection operation for selecting a certain test route from a plurality of test routes 255 to be tested as the selected test route for each testing.

However, taking advantage of several pluralities of selection transistors in conjunction with a selection circuit for sequentially selecting a certain test route from a plurality of test routes on a wafer or a chip to be tested for each testing is a well-known technology and, for the sake of brevity, further detailed description for test route selection architecture are omitted. In summary, the scope of the present invention is not limited thereto the embodiment shown in FIG. 2, and any defect detection system taking advantage of test route selection architecture together with an analog-to-digital converter for generating a test output code having a plurality of bits is within the spirit and scope of the invention.

Figure 5:
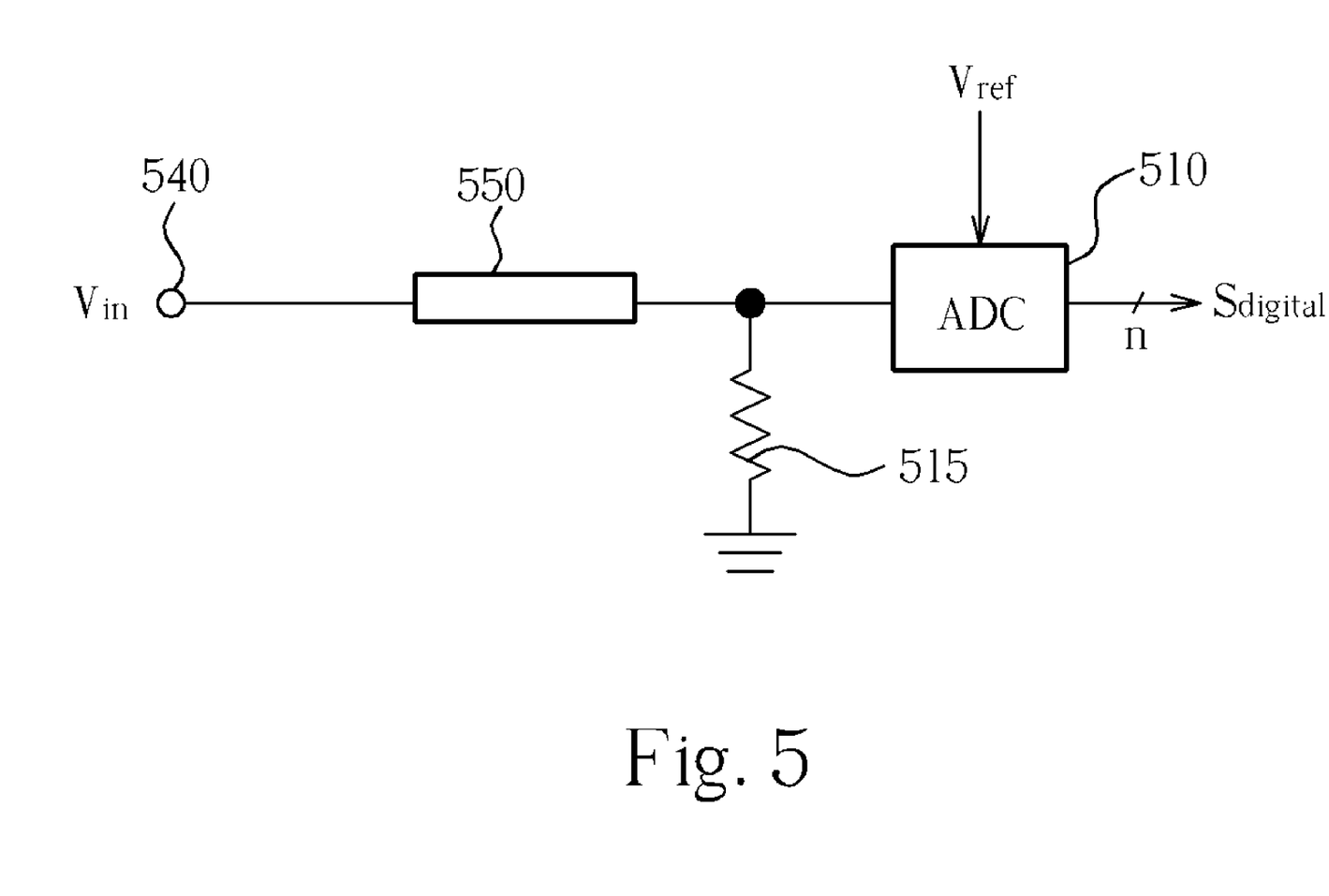
FIG. 5 is a schematic structure for performing a calibration mode operation of an open test for analyzing an open in a test route of an integrated circuit.
Figure 6:
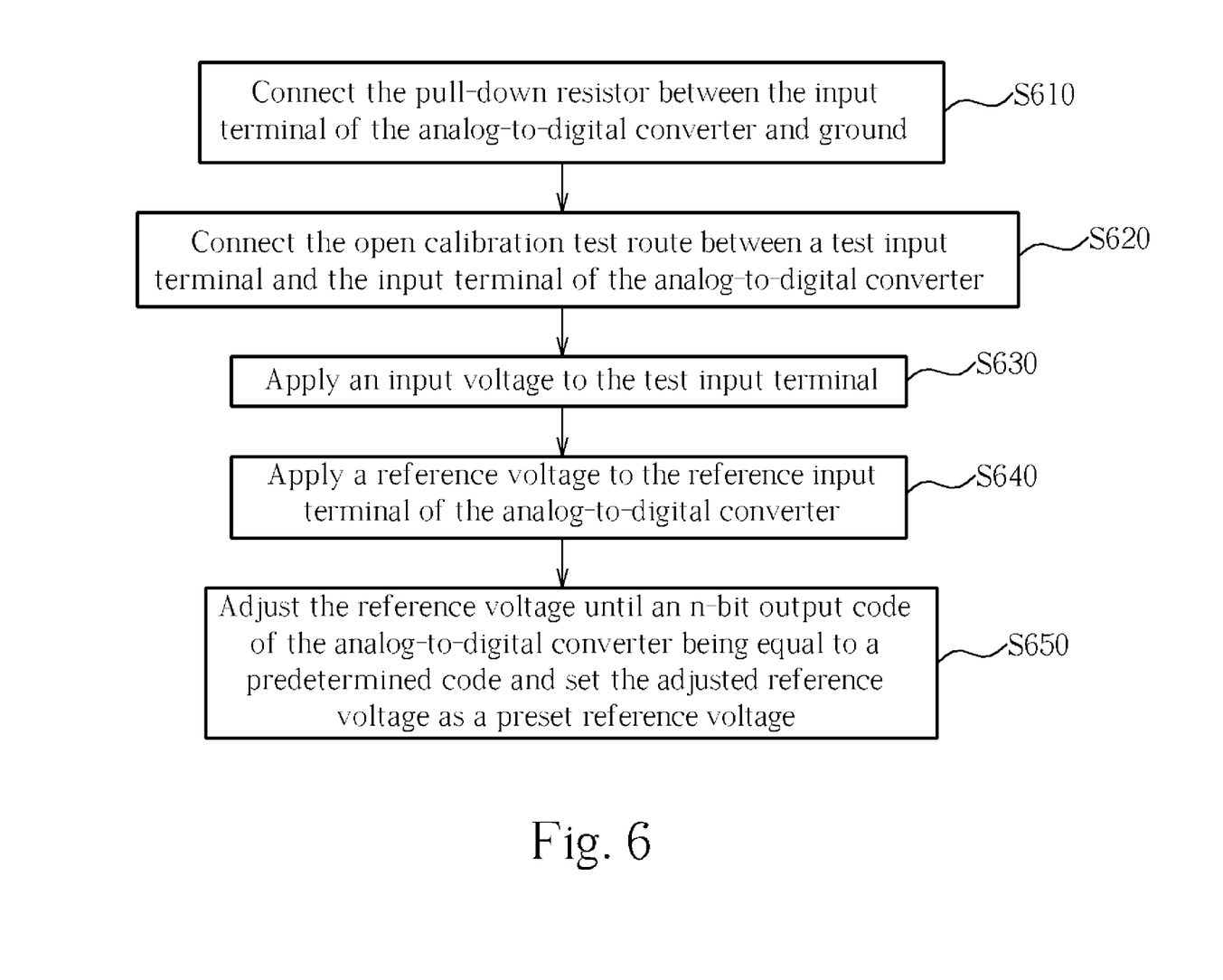
FIG. 6 is a flowchart depicting a method for performing the calibration mode operation of the open test according to the present invention.

Please refer to FIG. 5 together with FIG. 6. FIG. 5 is a schematic structure for performing a calibration mode operation of an open test for analyzing an open in a test route of an integrated circuit. FIG. 6 is a flowchart depicting a method for performing the calibration mode operation of the open test according to the present invention. The structure for performing the calibration operation of the open test comprises an analog-to-digital converter (ADC) 510, a pull-down resistor 515, and an open calibration test route 550. The calibrating method of the open test comprises the following steps:

Step S610: connect the pull-down resistor 515 between the input terminal of the analog-to-digital converter 510 and ground;

Step S620: connect the open calibration test route 550 between a test input terminal 540 and the input terminal of the analog-to-digital converter 510;

Step S630: apply an input voltage Vin to the test input terminal 540;

Step S640: apply a reference voltage Vref to the reference input terminal of the analog-to-digital converter 510; and Step S650: adjust the reference voltage Vref until an n-bit output code Sdigital of the analog-to-digital converter 510 is equal to a predetermined code and set the adjusted reference voltage as a preset reference voltage.

In the calibrating method of the open test described above, the operating sequence between the steps S610 and S620 is optional. That is, the step S610 can be performed before or after the step S620. Similarly, the operating sequence between the steps S630 and S640 is also optional. The pull-down resistor 515 can be replaced by a pull-down transistor having a gate furnished with an enable signal.

In one preferred embodiment, the open calibration test route 550 is selected to be a test route having route structure same as that of a test route waiting to be tested on a wafer or a chip to be tested. Moreover, the n-bit output code of the analog-to-digital converter 510 is a 3-bit code and the predetermined code is "100", which is a median-value code of the 3-bit code.

Figure 7:
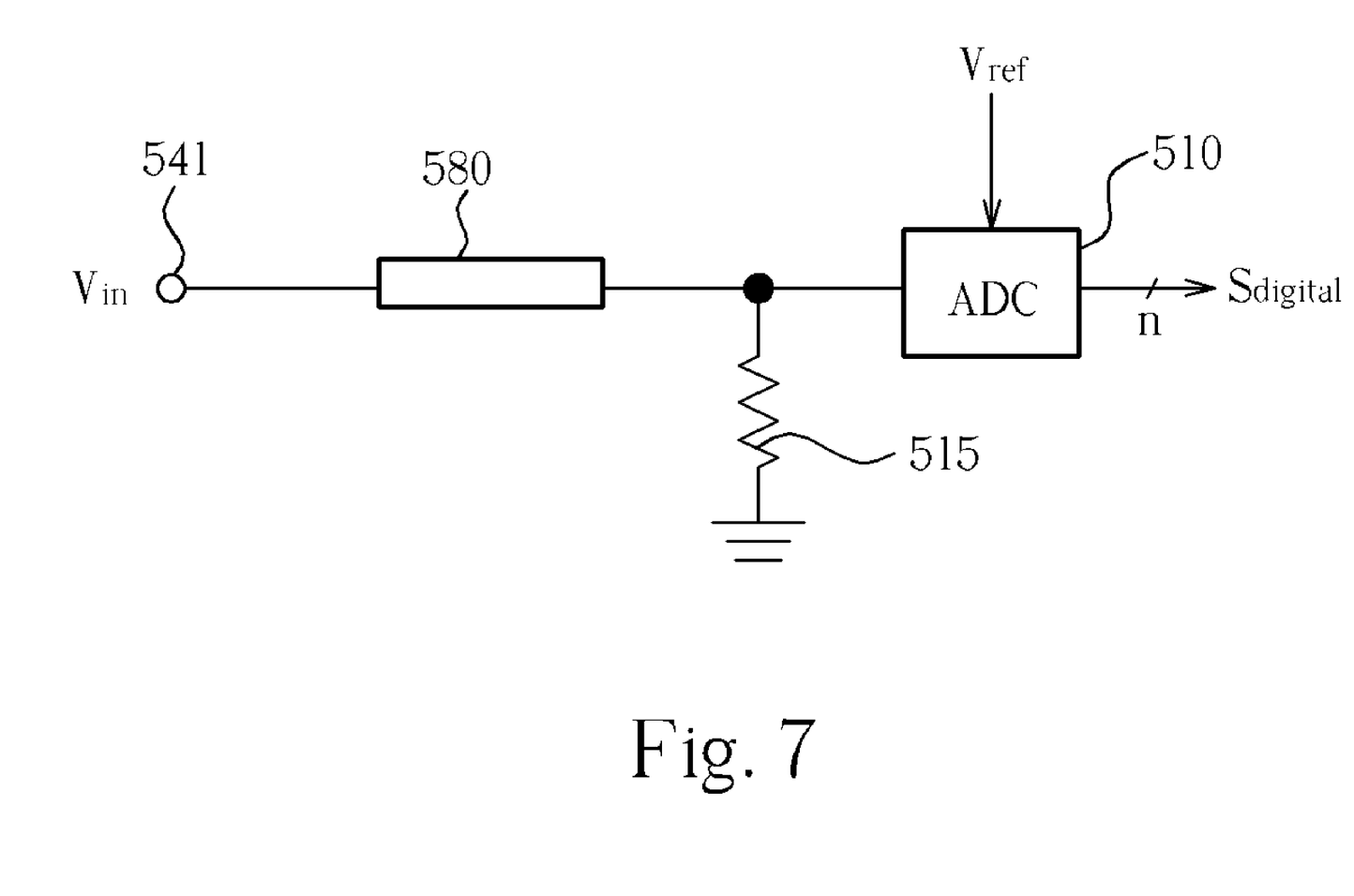
FIG. 7 is a schematic structure for performing a test mode operation of the open test so as to analyze an open in a test route of an integrated circuit.
Figure 8:
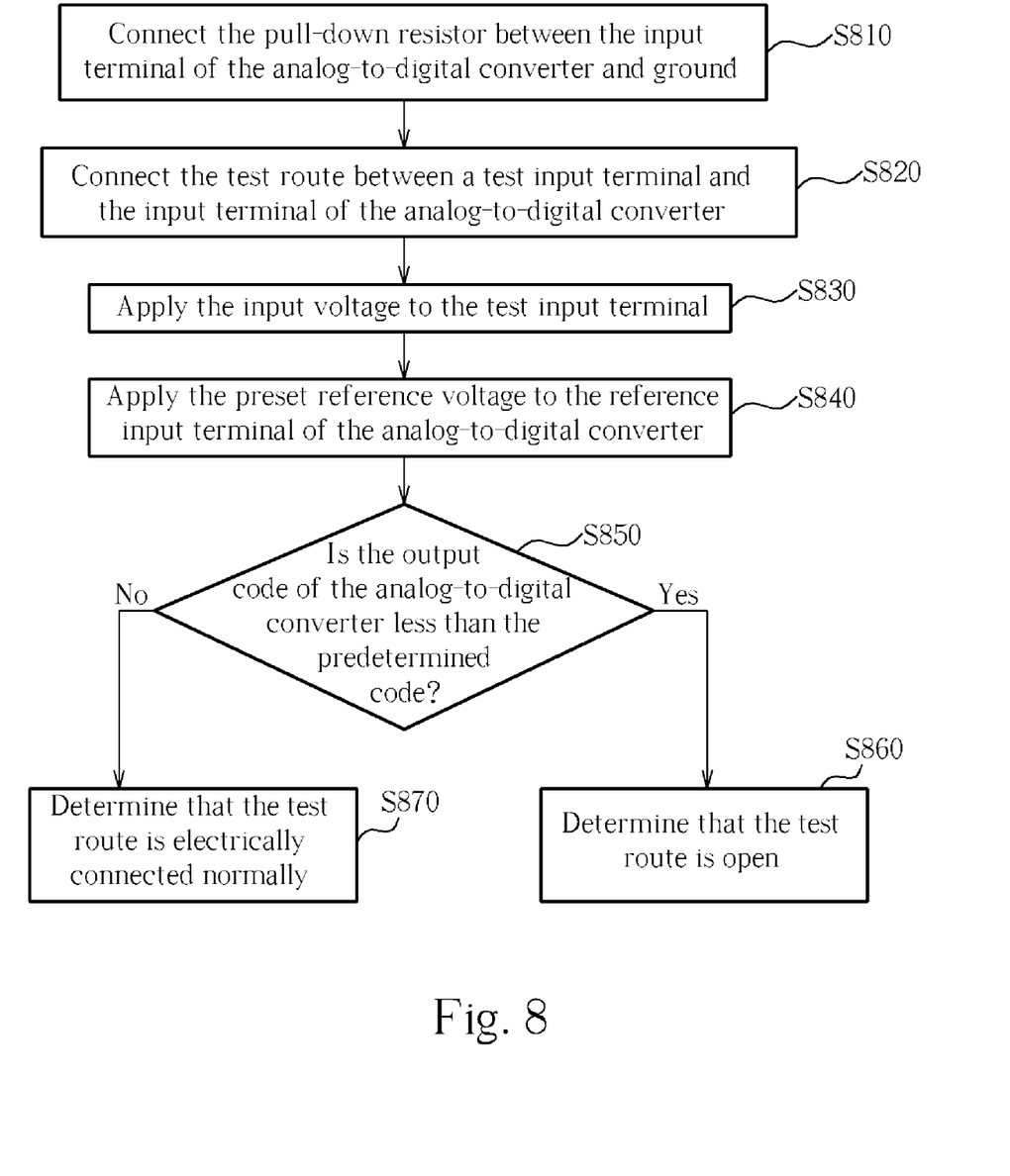
FIG. 8 is a flowchart depicting a method for performing the test mode operation of the open test according to the present invention.

Please refer to FIG. 7 in conjunction with FIG. 8. FIG. 7 is a schematic structure for performing a test mode operation of the open test so as to analyze an open in a test route of an integrated circuit. FIG. 8 is a flowchart depicting a method for performing the test mode operation of the open test according to the present invention. The structure for performing the testing operation of the open test comprises the analog-to-digital converter (ADC) 510, the pull-down resistor 515, and a test route 580. The test route 580 of the integrated circuit to be test can be a poly-crystal conduction line, a diffusion conduction line, a metal conduction line, or a P-type or N-type well conduction line. The testing method of the open test comprises the following steps:

Step S810: connect the pull-down resistor 515 between the input terminal of the analog-to-digital converter 510 and ground;

Step S820: connect the test route 580 between a test input terminal 541 and the input terminal of the analog-to-digital converter 510;

Step S830: apply an input voltage Vin, same as the input voltage used in the calibration method of the open test, to the test input terminal 541;

Step S840: apply the preset reference voltage Vref determined by the calibration mode operation of the open test to the reference input terminal of the analog-to-digital converter 510;

Step S850: detect whether or not the output code of the analog-to-digital converter 510 is less than the predetermined code, if the output code of the analog-to-digital converter 510 is less than the predetermined code of the open test, then go to step S860, else go to step S870;

Step S860: determine that the test route 580 is open; and

Step S870: determine that the test route 580 is electrically connected normally.

In the testing method of the open test described above, the operating sequence between the steps S810 and S820 is optional, and the operating sequence between the steps S830 and S840 is also optional.

Figure 9:
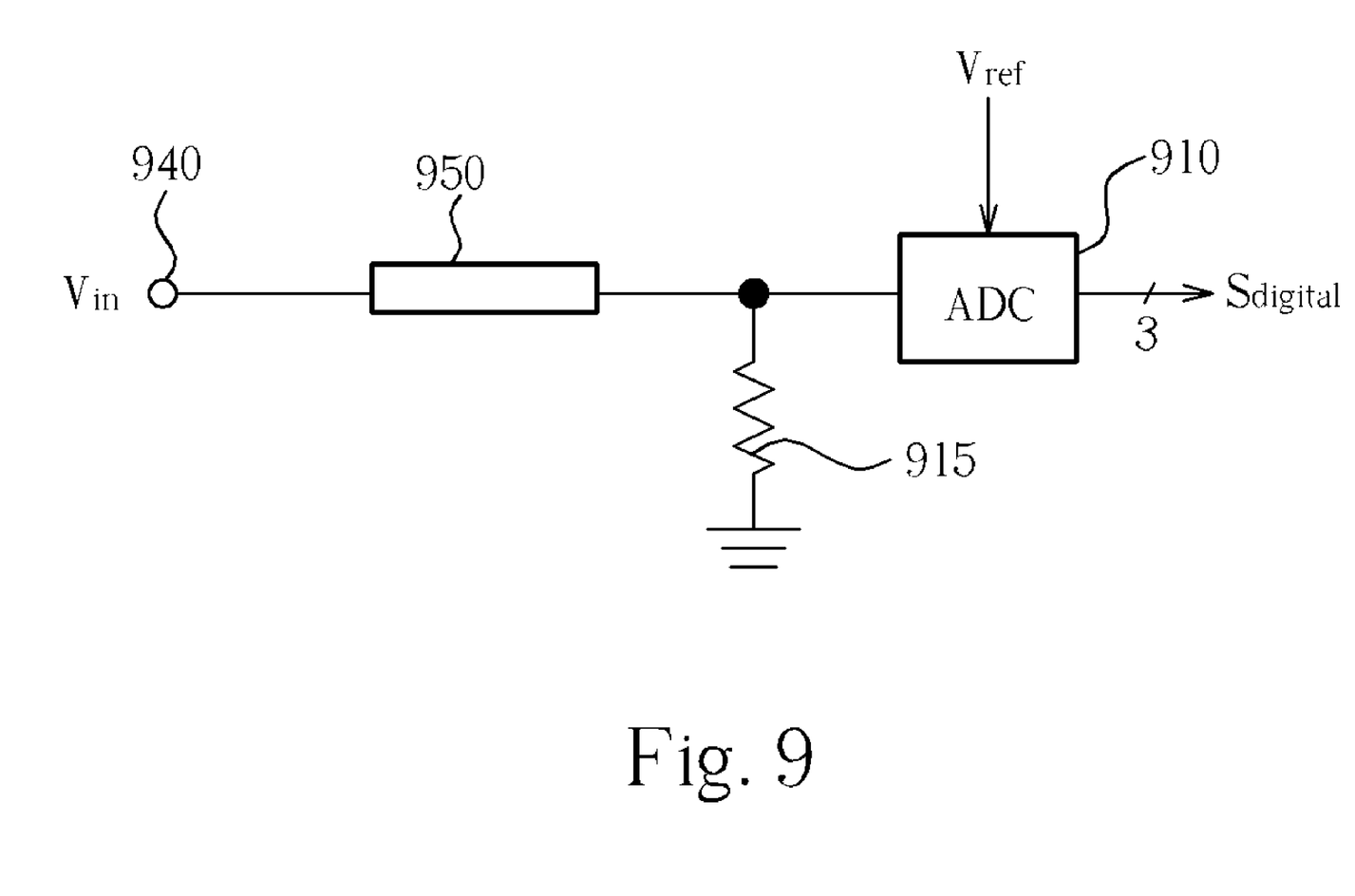
FIG. 9 is a schematic structure for performing a calibration mode operation of a short test for analyzing a short in a test route of an integrated circuit.
Figure 10:
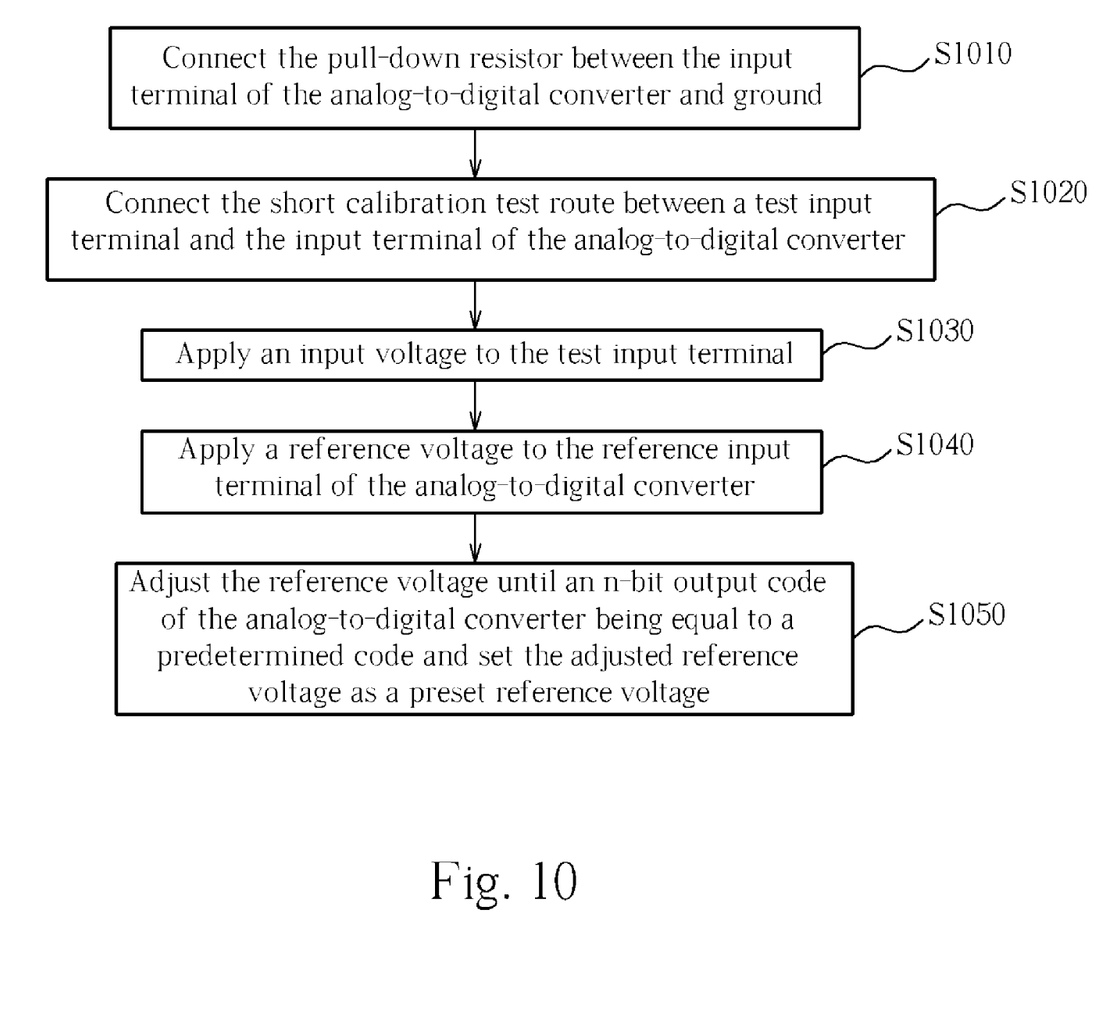
FIG. 10 is a flowchart depicting a method for performing the calibration mode operation of the short test according to the present invention.

Please refer to FIG. 9 together with FIG. 10. FIG. 9 is a schematic structure for performing a calibration mode operation of a short test for analyzing a short in a test route of an integrated circuit. FIG. 10 is a flowchart depicting a method for performing the calibration mode operation of the short test according to the present invention. The structure for performing the calibration operation of the short test comprises an analog-to-digital converter (ADC) 910, a pull-down resistor 915, and a short calibration test route 950. The calibrating method of the short test comprises the following steps:

Step S1010: connect the pull-down resistor 915 between the input terminal of the analog-to-digital converter 910 and ground;

Step S1020: connect the short calibration test route 950 between a test input terminal 940 and the input terminal of the analog-to-digital converter 910;

Step S1030: apply an input voltage Vin to the test input terminal 940;

Step S1040: apply a reference voltage Vref to the reference input terminal of the analog-to-digital converter 910; and Step S1050: adjust the reference voltage Vref until an n-bit output code Sdigital of the analog-to-digital converter 910 is equal to a predetermined code and set the adjusted reference voltage as a preset reference voltage.

In the calibrating method of the short test described above, the operating sequence between the steps S1010 and S1020 is optional, and the operating sequence between the steps S1030 and S1040 is also optional. The pull-down resistor 915 can be replaced by a pull-down transistor having a gate furnished with an enable signal.

In one preferred embodiment, the short calibration test route 950 is selected to be a test route having route structure same as that of a test route waiting to be tested on a wafer or a chip to be tested. Moreover, the n-bit output code of the analog-to-digital converter 910 is a 3-bit code and the predetermined code is "000" or "001", which are lowest and second-lowest values of the 3-bit code for taking noise effect into consideration.

Figure 11:
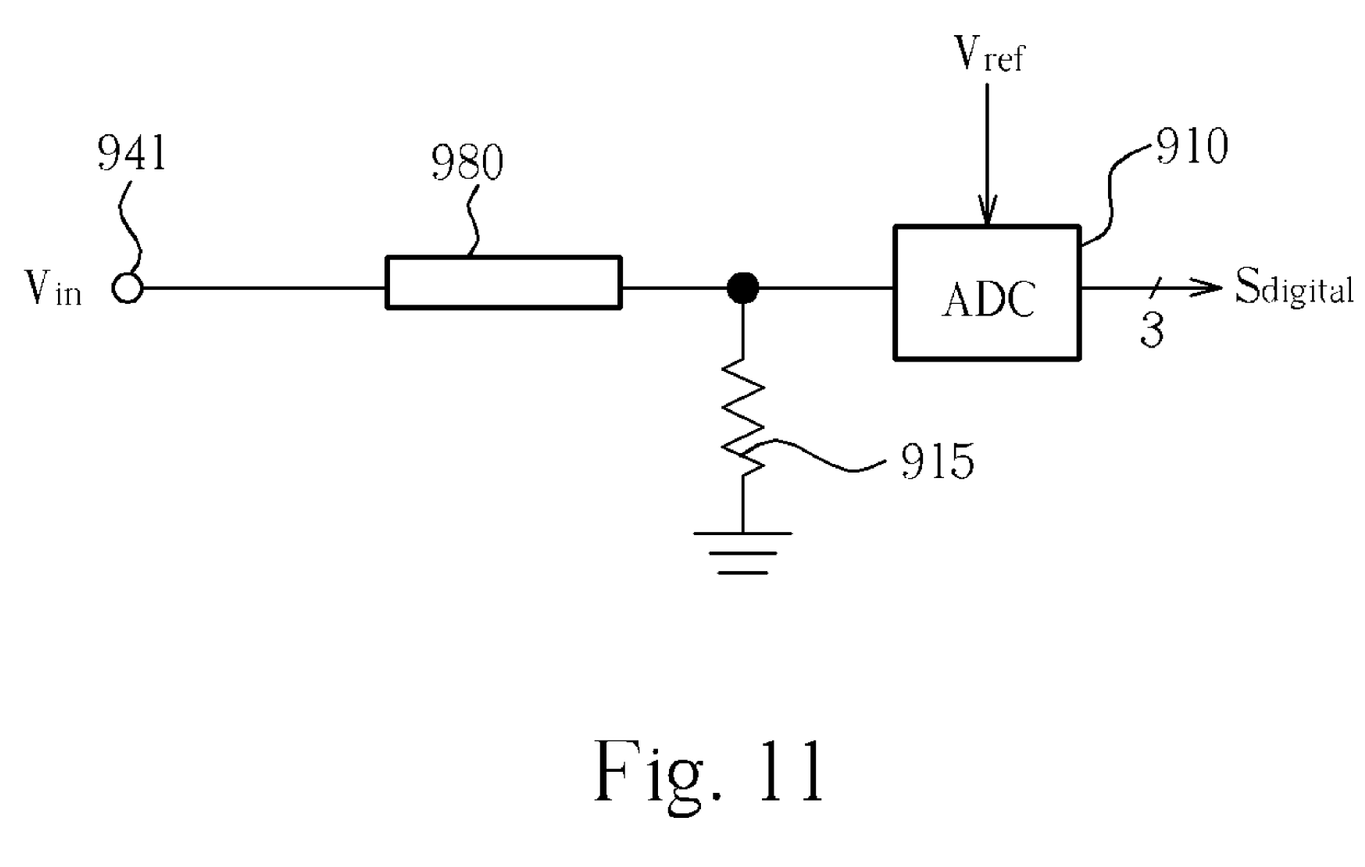
FIG. 11 is a schematic structure for performing a test mode operation of the short test so as to analyze a short in a test route of an integrated circuit.
Figure 12:
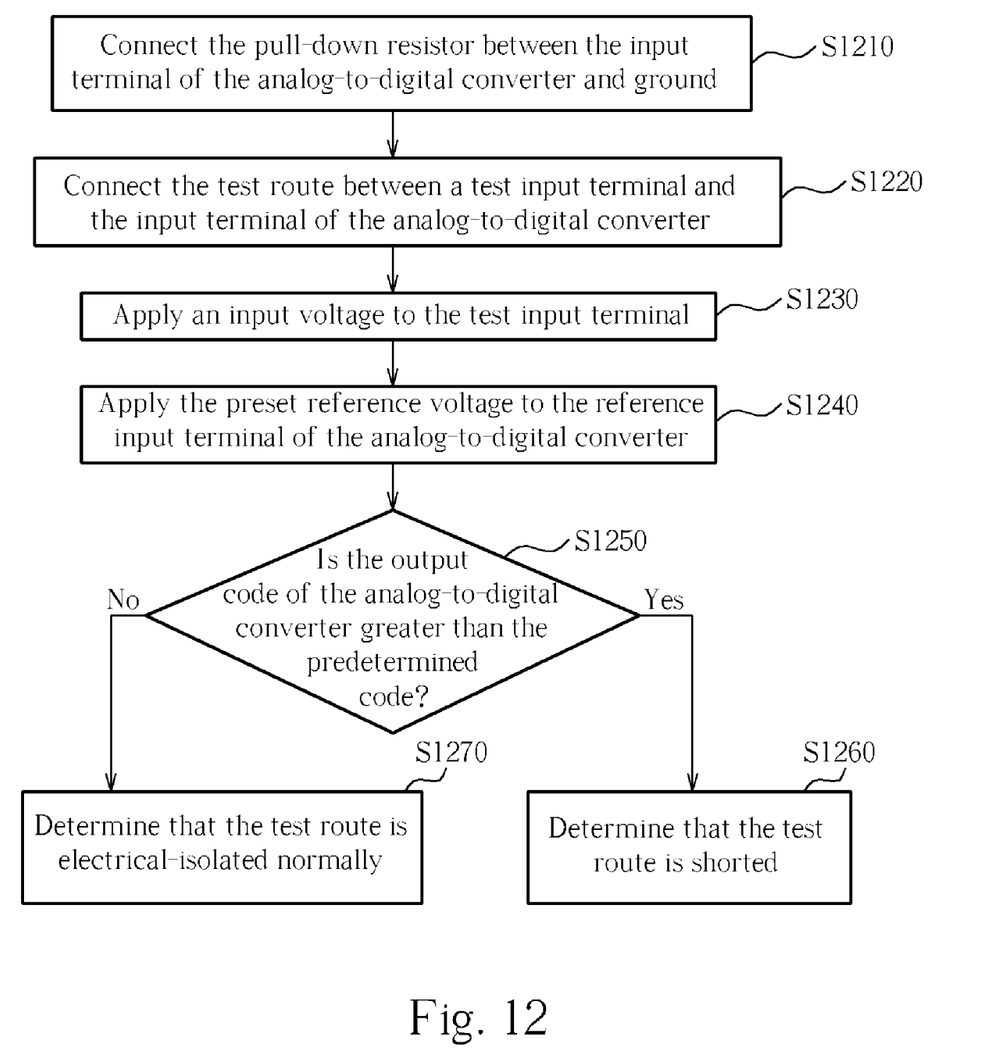
FIG. 12 is a flowchart depicting a method for performing the test mode operation of the short test according to the present invention.

Please refer to FIG. 11 in conjunction with FIG. 12. FIG. 11 is a schematic structure for performing a test mode operation of the short test so as to analyze a short in a test route of an integrated circuit. FIG. 12 is a flowchart depicting a method for performing the test mode operation of the short test according to the present invention. The structure for performing the testing operation of the short test comprises the analog-to-digital converter (ADC) 910, the pull-down resistor 915, and a test route 980. The test route 980 of the integrated circuit to be test is an electrical-isolated route, which can be a combination of two adjacent and electrical-isolated conduction lines with each conduction line being a poly-crystal conduction line, a diffusion conduction line, a metal conduction line, or a P-type or N-type well conduction line. The testing method of the short test comprises the following steps:

Step S1210: connect the pull-down resistor 915 between the input terminal of the analog-to-digital converter 910 and ground;

Step S1220: connect the test route 980 between a test input terminal 941 and the input terminal of the analog-to-digital converter 910;

Step S1230: apply an input voltage Vin, same as the input voltage used in the calibration method of the short test, to the test input terminal 941;

Step S1240: apply the preset reference voltage Vref determined by the calibration mode operation of the short test to the reference input terminal of the analog-to-digital converter 910;

Step S1250: detect whether or not the output code of the analog-to-digital converter 910 is greater than the predetermined code, if the output code of the analog-to-digital converter 910 is greater than the predetermined code of the short test, then go to step S1260, else go to step S1270;

Step S1260: determine that the test route 980 is shorted; and

Step S1270: determine that the test route 980 is electrical-isolated normally.

In the testing method of the short test described above, the operating sequence between the steps S1210 and S1220 is optional, and the operating sequence between the steps S1230 and S1240 is also optional.

In addition, the step S1260 of the testing method of the short test may further comprises performing a short classification based on a code difference between the output code of the analog-to-digital converter 910 and the predetermined code, which means that a shorting situation occurred to the test route 980 is more serious as the code difference is higher. In other words, the conductivity between the test input terminal 941 and the input terminal of the analog-to-digital converter 910 is higher with a higher code difference between the output code of the analog-to-digital converter 910 and the predetermined code. Accordingly, the short classification can be performed based on the code difference.

To sum up, the defect detection system and related methods provide multilevel output signals to identify open or short defects in an integrated circuit for achieving higher operational flexibility.

Those skilled in the art will readily observe that numerous modifications and alterations of the device and method may be made while retaining the teachings of the invention.

What is claimed is:

1. A method for performing an open test for analyzing an open in a test route of an integrated circuit comprising:

connecting a pull-down device between an input terminal of an analog-to-digital converter and ground;
connecting an open calibration test route between a test input terminal and the input terminal of the analog-to-digital converter;
applying an input voltage to the test input terminal;
applying a reference voltage to a reference input terminal of the analog-to-digital converter;
adjusting the reference voltage until an output code of the analog-to-digital converter is equal to a predetermined code and setting the adjusted reference voltage as a preset reference voltage;
connecting the test route between the test input terminal and the input terminal of the analog-to-digital converter;
applying the input voltage to the test input terminal;
applying the preset reference voltage to the reference input terminal of the analog-to-digital converter; and
determining whether the test route is open by comparing an output code of the analog-to-digital converter with the predetermined code.

2. The method of claim 1, wherein the predetermined code is a median-value code of the output code of the analog-to-digital converter.

3. The method of claim 1, wherein the output code of the analog-to-digital converter is a 3-bit code and the predetermined code is "100".

4. The method of claim 1, wherein determining whether the test route is open according to an output code of the analog-to-digital converter comprises determining that the test route is open when the output code of the analog-to-digital converter is less than a predetermined code.

5. The method of claim 1, wherein determining whether the test route is open according to an output code of the analog-to-digital converter comprises determining that the test route is electrically connected normally when the output code of the analog-to-digital converter is not less than a predetermined code.

6. A method for performing a short test for analyzing a short in a test route of an integrated circuit comprising:

connecting a pull-down device between an input terminal of an analog-to-digital converter and ground;
connecting a short calibration test route between a test input terminal and the input terminal of the analog-to-digital converter;
applying an input voltage to the test input terminal;
applying a reference voltage to a reference input terminal of the analog-to-digital converter;
adjusting the reference voltage until an output code of the analog-to-digital converter is equal to a predetermined code and setting the adjusted reference voltage as a preset reference voltage;
connecting the test route between the test input terminal and the input terminal of the analog-to-digital converter;
applying the input voltage to the test input terminal;
applying the preset reference voltage to the reference input terminal of the analog-to-digital converter; and
determining whether the test route is shorted by comparing an output code of the analog-to-digital converter with the predetermined code.

7. The method of claim 6, wherein the predetermined code is a lowest-value code or a second-lowest-value code of the output code of the analog-to-digital converter.

8. The method of claim 6, wherein the output code of the analog-to-digital converter is a 3-bit code and the predetermined code is "000" or "001".

9. The method of claim 6, wherein determining whether the test route is shorted according to the output code of the analog-to-digital converter comprises determining that the test route is shorted when the output code of the analog-to-digital converter is greater than a predetermined code.

10. The method of claim 6, wherein determining whether the test route is shorted according to the output code of the analog-to-digital converter comprises determining that the test route is electrical-isolated normally when the output code of the analog-to-digital converter is not greater than a predetermined code.

11. The method of claim 6, wherein determining whether the test route is shorted according to the output code of the analog-to-digital converter comprises determining a short classification based on a code difference between the output code of the analog-to-digital converter and a predetermined code when the output code is greater than the predetermined code.

* * * * *